United States Patent
Park et al.

(10) Patent No.: US 8,153,338 B2
(45) Date of Patent: Apr. 10, 2012

(54) APPARATUS AND METHOD FOR REPAIRING PHOTO MASK

(75) Inventors: Byong Chon Park, Daejeon (KR); Sang Jung Ahn, Daejeon (KR); Jin Ho Choi, Incheon (KR); Joon Lyou, Seoul (KR); Jae Wan Hong, Seoul (KR); Won Young Song, Incheon (KR); Ki Young Jung, Seoul (KR)

(73) Assignees: Nanofocus Inc., Seoul (KR); Korea Research Institute of Standards and Science, Daejeon (KR)

( * ) Notice: Subject to any disclaimer, the term of this patent is extended or adjusted under 35 U.S.C. 154(b) by 0 days.

(21) Appl. No.: 12/805,416

(22) Filed: Jul. 29, 2010

(65) Prior Publication Data
US 2011/0027698 A1 Feb. 3, 2011

Related U.S. Application Data

(63) Continuation of application No. PCT/KR2009/000451, filed on Jan. 30, 2009.

(30) Foreign Application Priority Data

Jan. 30, 2008 (KR) .................. 10-2008-0009662

(51) Int. Cl.
- G03F 1/00 (2012.01)
- G06K 9/00 (2006.01)
- G21G 5/00 (2006.01)

(52) U.S. Cl. .................. 430/5; 382/144; 250/492.2

(58) Field of Classification Search ................ 430/5, 30, 430/394; 716/50–56; 382/144
See application file for complete search history.

(56) References Cited

U.S. PATENT DOCUMENTS

| | | | |
|---|---|---|---|
| 6,197,455 B1 | 3/2001 | Yedur et al. | |
| 6,407,373 B1 | 6/2002 | Dotan | |
| 7,375,352 B2 * | 5/2008 | Takaoka et al. | 250/492.2 |
| 7,420,164 B2 | 9/2008 | Nakasuji et al. | |
| 2003/0207184 A1 * | 11/2003 | Smith | 430/5 |
| 2004/0175631 A1 | 9/2004 | Crocker et al. | |
| 2006/0011830 A1 * | 1/2006 | Shirakawabe et al. | 250/306 |
| 2007/0281222 A1 | 12/2007 | Doi et al. | |

FOREIGN PATENT DOCUMENTS

JP 2006-019326 A 1/2006

* cited by examiner

*Primary Examiner* — Stephen Rosasco

(74) *Attorney, Agent, or Firm* — Lee & Morse, P.C.

(57) ABSTRACT

An apparatus for repairing a photo mask, including a repairing atomic force microscope configured to repair a defective portion of the photo mask in a photo mask repair process, an electron microscope configured to navigate the repairing atomic electron microscope to the defective portion of the photo mask and to observe the photo mask repair process, and an imaging atomic microscope configured to image in-situ a shape of a repaired photo mask.

10 Claims, 4 Drawing Sheets

APPARATUS AND METHOD FOR REPAIRING PHOTO MASK

CROSS-REFERENCE TO RELATED APPLICATION

This application is a continuation of pending International Application No. PCT/KR2009/000451, entitled "Apparatus and Method for Repairing Photo Mask," which was filed on Jan. 30, 2009, the entire contents of which are hereby incorporated by reference for all purposes.

BACKGROUND

1. Field

Embodiments relate to an apparatus and a method for repairing a photo mask.

2. Description of the Related Art

An integrated circuit (IC) may be manufactured through steps of circuit design, wafer fabrication, test, and packaging. A layout may be formed, which is a set of patterns to be transferred to a silicon wafer. Such patterns may be formed through the use of photolithographic process using photo masks or reticles. A photo mask may include a transparent fused silica substrate on which chromium patterns are formed.

Defects in a manufactured photo mask can be a source of yield reduction in integrated circuit (IC) process. These defects may include contaminations, chromium spots, apertures, residues, lack of adhesion, depressions, or scratches, which may be generated during a photo mask design process, a photo mask manufacturing process, and subsequent wafer processing.

SUMMARY

It is a feature of an embodiment to provide an apparatus and/or a method for precisely repairing a photo mask having reduced width.

It is another feature of an embodiment to provide an apparatus and/or a method for precisely repairing a photo mask using a probe of an atomic force microscope.

At least one of the above and other features and advantages may be realized by providing an apparatus for repairing a photo mask, including a repairing atomic force microscope configured to repair a defective portion of the photo mask in a photo mask repair process, an electron microscope configured to navigate the repairing atomic electron microscope to the defective portion of the photo mask and to observe the photo mask repair process, and an imaging atomic microscope configured to image in-situ a shape of a repaired photo mask.

The apparatus may further include an incident angle controller configured to control an incident angle of an electron gun of the electron microscope.

The apparatus may further include a replacement probe loading part configured to load a replacement probe to replace the replacement probe for a machining probe of the repairing atomic force microscope according to abrasion of the machining probe.

The apparatus may further include an optical microscope configured to observe an approach of a probe of the repairing atomic force microscope to the photo mask.

The apparatus may further include an ion beam device configured to assist in repair of the photo mask by a machining probe of the repairing atomic force microscope.

At least one of the above and other features and advantages may also be realized by providing a method for repairing a photo mask, the method including locating a machining probe of a repairing atomic force microscope at a defective portion of a photo mask, reciprocating the machining probe to remove the defective portion of the photo mask, using a scanning electron microscope to observe a photo mask repair process of the machining probe, and imaging in-situ a shape of a repaired photo mask using an imaging probe of an imaging atomic microscope, the imaging probe being different from the machining probe.

The method may further include imaging the defective portion of the photo mask by the machining probe or the imaging probe before removing the defective portion of the photo mask.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
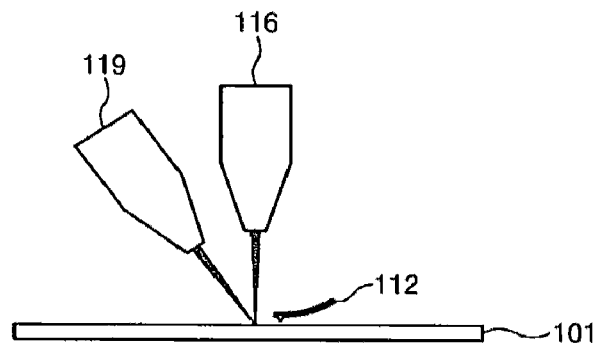
FIG. 1 illustrates a schematic diagram of an apparatus for repairing a photo mask according to embodiments.

Korean Patent Application No. 10-2008-0009662, filed on Jan. 30, 2008, in the Korean Intellectual Property Office, and entitled: "Apparatus and Method for Repairing Photo Mask," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
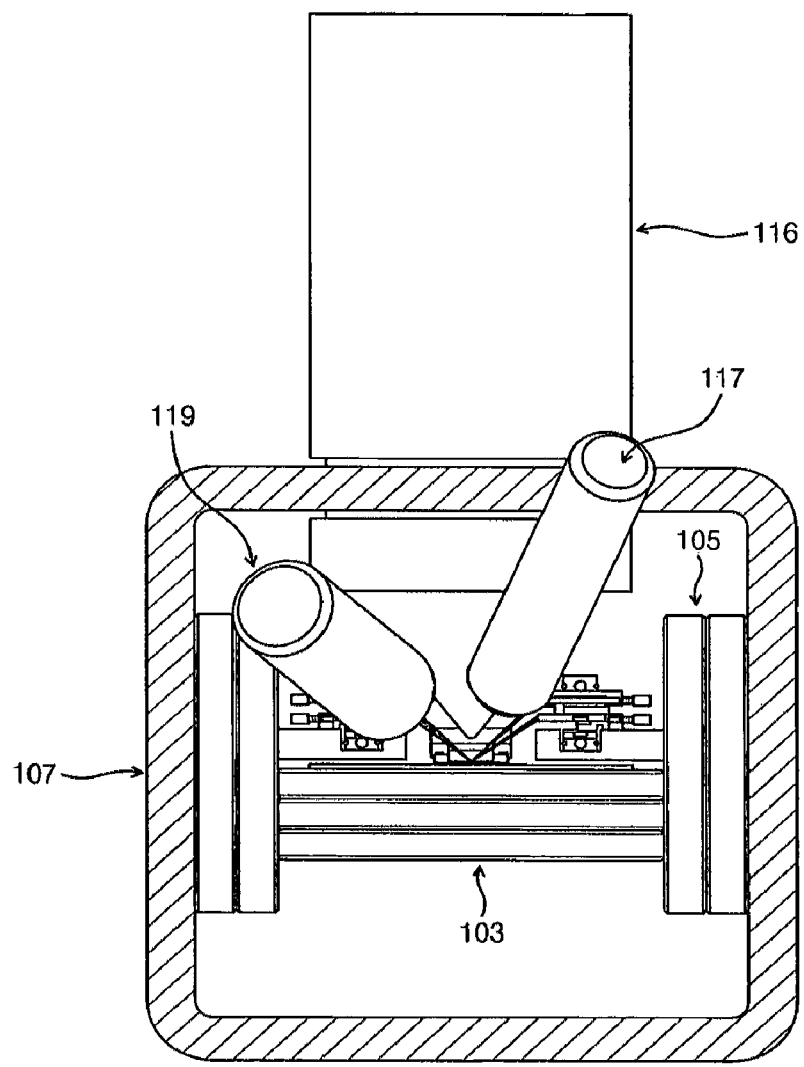
FIGS. 2 and 3 illustrate an apparatus for repairing a photo mask according to embodiments.
Figure 3:
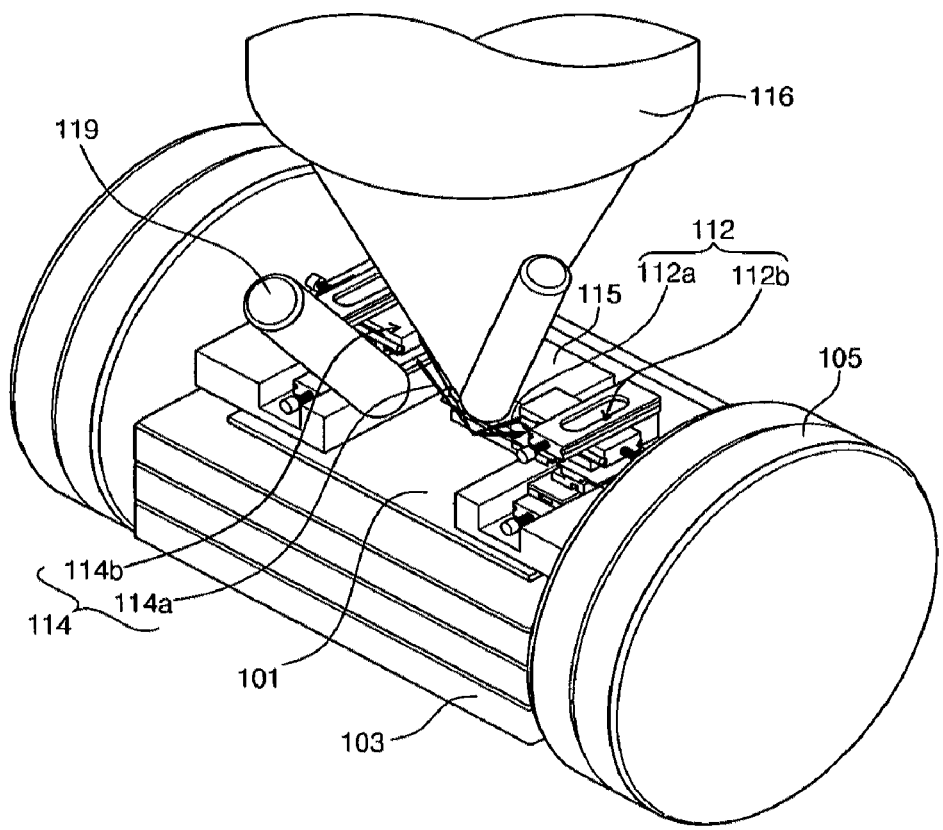

FIG. 1 illustrates a schematic diagram of an apparatus for repairing a photo mask according to embodiments, and FIGS. 2 and 3 illustrate an apparatus for repairing the photo mask according to embodiments.

Referring to FIGS. 1, 2 and 3, the apparatus according to an embodiment may include a loading table 103 for loading a photo mask 101 to be repaired and a repair unit on the loading table 103. The photo mask 101, the loading table 103, and the repair unit may be disposed inside a vacuum chamber 107. The loading table 103 may be an XY stage which is translatable in X and Y axis directions. The loading table 103 may be fixed to the vacuum chamber 107 via a rotation stage 105. The rotation stage 105 may rotate with respect to a rotation shaft (not shown) fixed to the vacuum chamber 107. Thus, the photo mask 101 loaded on the loading table 103 may travel in the X and Y axis directions and rotate.

The repair unit may be provided on the loading table 103 and may include a repairing atomic force microscope (AFM) 112, an imaging atomic force microscope (AFM) 114, a replacement atomic force microscope (AFM) probe loading part 115 (hereinafter referred to "replacement probe loading part"), a scanning electron microscope (SEM) 116, an optical microscope 117, an ion beam device 119, and a control part (not shown) for control thereof. The repairing AFM 112, the imaging AFM 114, and the replacement probe loading part 115 may be fixed to the rotation stage 105 on the loading table 103. Thus, the photo mask 101 may be loaded between the repairing AFM 112 and the loading table 103, and/or between the imaging AFM 114 and the loading table 103.

The repairing AFM 112 may be provided to repair a defective portion of the photo mask 101. The repairing AFM 112 may include a machining probe 112*a*, a probe driver 112*b* for positioning the machining probe 112*a* in the X and Y axis directions, and a driver (not shown) for the control of reciprocation of the machining probe 112*a*. The probe driver 112*b* may enable the machining probe 112*a* to be precisely disposed at the defective portion of the photo mask 101. The machining probe 112*a* may be reciprocated and/or scanned by a generally-known method of driving an atomic force microscope. The driver (not shown) may reciprocate the machining probe 112*a* such that the machining probe 112*a* removes the defective portion of the photo mask 101.

Apart from the repairing AFM 112, the imaging AFM 114 may be additionally provided for in-situ monitoring the shape of a repaired photo mask 101. The imaging AFM 114 may include an imaging probe 114*a*, a probe driver 114*b* for positioning the imaging probe 114*a* in the X and Y axis directions, and a driver (not shown) for the control of the reciprocation of the imaging probe 114*a*. The machining probe 112*a* may be easily worn by the interaction with a pattern of the photo mask 101. Thus, an image obtained by the machining probe 112*a* may be distorted from a real image. In this regard, if the photo mask 101 is imaged using the imaging probe 114*a* different from the machining probe 112*a*, the repaired patterns on the photo mask 101 may be accurately imaged. The driver (not shown) may allow the imaging probe 114*a* to be reciprocated and/or scanned by a generally-known method of driving an AFM. The machining probe 112*a* and the imaging probe 114*a* may be disposed toward the photo mask 101 in an inclined direction relative to a surface of the photo mask 101.

As the machining probe 112*a* is worn, the worn machining probe 112*a* may need to be replaced by a new machining probe (not shown). Accordingly, while loading the new machining probe, the replacement probe loading part 115 may replace the worn machining probe 112*a* by the new machining probe in accordance with the command of the control part.

Spatial resolution of the SEM 116 may be at least 200 times higher than that of a typical optical microscope. Focal depth of the SEM 116 may be at least 1000 times greater than that of a typical optical microscope. Magnification change of the SEM 116 may be conducted more freely than a typical optical microscope. The SEM 116 may allow a user to rapidly observe a wider and deeper region than an AFM. The SEM 116 may be provided to find out a defective portion of the photo mask 101. The SEM 116 may be used to rapidly navigate the machining probe 112*a* to the defective portion of the photo mask 101. Thus, while visually observing the photo mask 101 and/or the repairing AFM 112 through SEM 116, the user may find out or identify the defective portion of the photo mask 101, and may locate the machining probe 112*a* at the defective portion of the photo mask 101. Further, the SEM 116 may allow the user to observe a repair process of the photo mask 101 being performed by the repairing AFM 112, and to inspect a degree of wear of the machining probe 112*a*. The optical microscope 117 is provided to observe the approach of the probes 112*a* and/or 114*a* to the photo mask 101. For example, the defective portion detected by a defect inspection system may be roughly located with the aid of the optical microscope 117. When the photo mask 101 is repaired using the repairing AFM 112, the ion beam device 119 may assist the repair of the photo mask 101.

The SEM 116, the optical microscope 117, and the ion beam device 119 may be fixed to the vacuum chamber 107. An incident angle of an electron gun of the SEM 116 may be controlled by using an electron gun incident angle controller, e.g., by driving the rotation stage 105. The control of the incident angle may prevent the optical microscope or AFM and ion beam devices from covering up the defective portion of the photo mask 101. Thus, the repair process of the photo mask 101 may be observed in real time.

The control part (not shown) may display images of the AFM 114, the SEM 116, and the optical microscope 117, and may control the driving of the repairing AFM 112, the replacement probe loading part 115, and the ion beam device 119.

Figure 4:
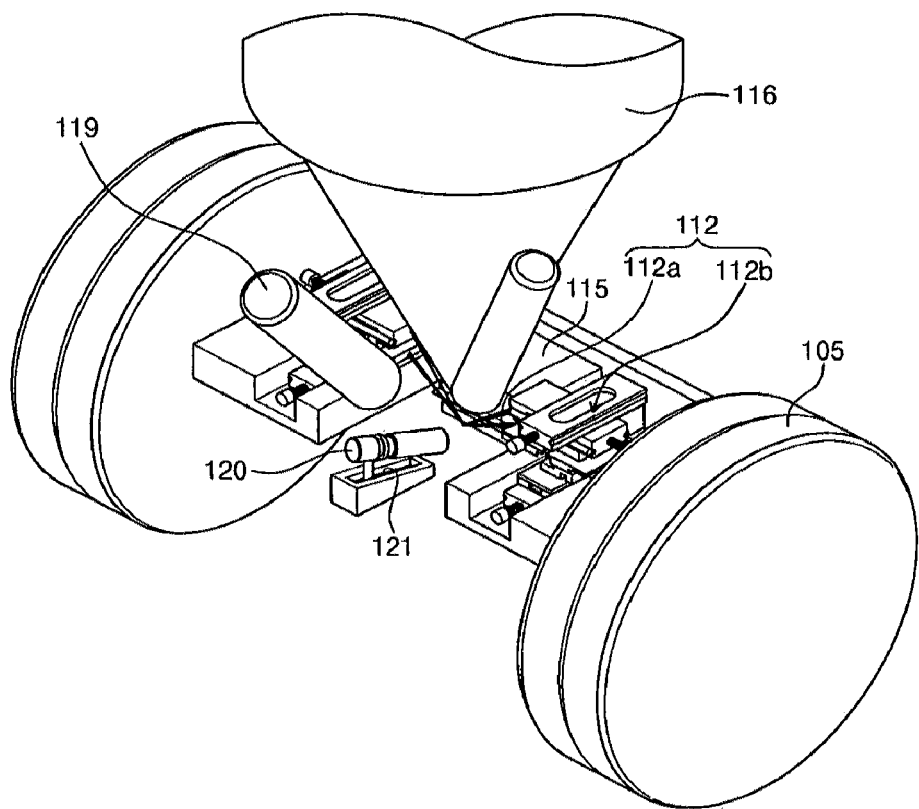
FIG. 4 illustrates an apparatus for repairing a photo mask according to a modified embodiment.

Referring to FIG. 4, according to another embodiment, an apparatus for repairing a photo mask may further include a micro electron column 120 and a micro electron column sliding stage 121. The micro electron column 120 may be provided to monitor the degree of wear of the machining probe 112*a*, and the micro electron column sliding stage 121 may be provided to allow the micro electron column 120 to approach the machining probe 112*a*.

An angle of the machining probe 112*a* with respect to the micro electron column 120 may be controlled by driving the rotation stage 105 to precisely check the degree of wear of the machining probe 112*a*. The control of the angle may prevent the optical microscope or AFM and ion beam devices from covering up the machining probe 112*a*. Before driving the rotation stage 105, the photo mask 101 may be translated by driving the loading table 103. Therefore, the rotation stage may be freely rotated.

Figure 5:
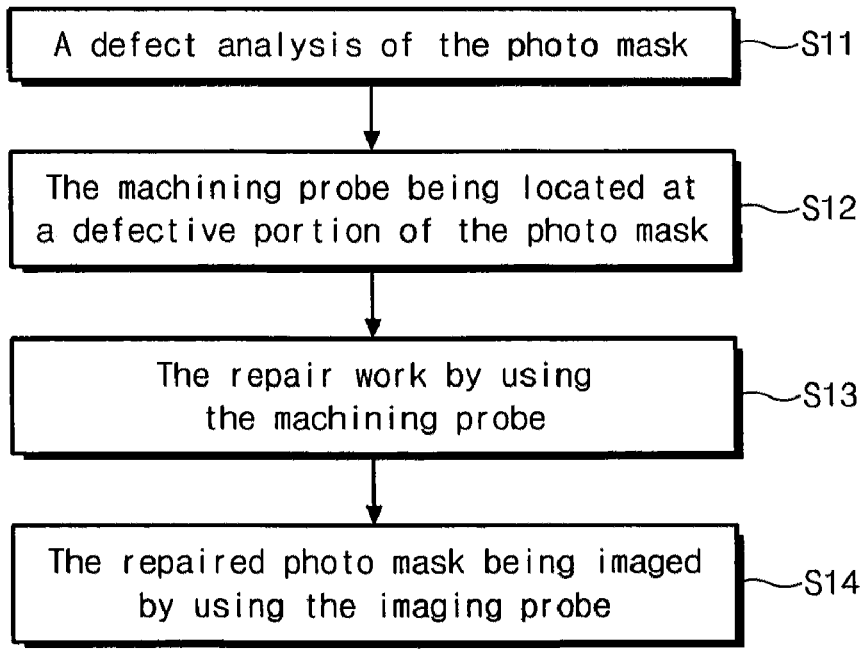
FIG. 5 illustrates a flowchart illustrating a method for repairing a photo mask according to embodiments.

Referring to FIG. 5, a method for repairing a photo mask according to example embodiments will now be described.

A defect position reported by the defect inspection system may be roughly navigated to using the electron microscope 116 or the optical microscope 117. The electron microscope may have a superior spatial resolution relative to a typical optical microscope, and may thus allow the user to rapidly observe a wider and deeper region on the photo mask. Thus, a defect position of a photo mask 101 may be found out or identified rapidly, i.e., high-speed mask navigation may be achieved. Around the identified defect position, a defective portion of the photo mask 101 may be imaged using the machining probe 112*a* or the imaging probe 112*b* to precisely locate the defect position of the photo mask 101 (S11).

The machining probe 112*a* may be located at the defective portion of the photo mask 101, based on the navigation result of the SEM 116 or the optical microscope 117 (S12).

Using, e.g., reciprocal operation of the machining probe 112a, the defective portion of the photo mask 101 may be removed to perform a repair work (S13).

Generally, real-time imaging of a photo mask repair process may not be possible, such that the repair work must be stopped for a while to determine an optimal endpoint of the repairing work through imaging with the machining probe 112a. In contrast, according to example embodiments, a repair process may be observed with the aid of SEM 116 while the machining probe 112a is operating, i.e., the repair work for the photo mask 101 may be seen using the SEM 116 in real time. Thus, the optimal endpoint of the repairing work may be determined efficiently.

Generally, a probe and a photo mask may need to be separated during repair work to check an abrasion state of the machining probe, and it may be difficult to locate the separated probe and photo mask at their original positions. In contrast, according to example embodiments, the machining probe may be replaced without changing position of the photo mask. Thus, difficulties in realigning the photo mask may be reduced or eliminated. In further detail, as the repair work is repeated, a defect of the photo mask 101 may be corrected but the machining probe 112a may become worn. The abrasion and/or contamination state of the machining probe 112a may be observed using the SEM 116. If the abrasion state of the machining probe 112a is not good, the repair work may be stopped and the machining probe 112a may be replaced with another probe by the replacement probe loading part 115.

Generally, a repaired photo mask may be imaged using a machining probe. However, the machining probe is apt to be worn or contaminated during a repair work, deteriorating the reproducibility of an AFM image obtained by the machining probe. Thus, the probe and the photo mask may need to be separated during the repair work to monitor an abrasion state of the machining probe, and it may be difficult to locate the separated probe and photo mask at their original positions. In contrast, according to example embodiments, the repaired photo mask may be monitored in-situ using the imaging probe 114a, which may be different from the machining probe 112a (S14). Thus, according to example embodiments, by using a separate high quality probe dedicated to imaging, the repair state may be accurately examined.

Figure 6:
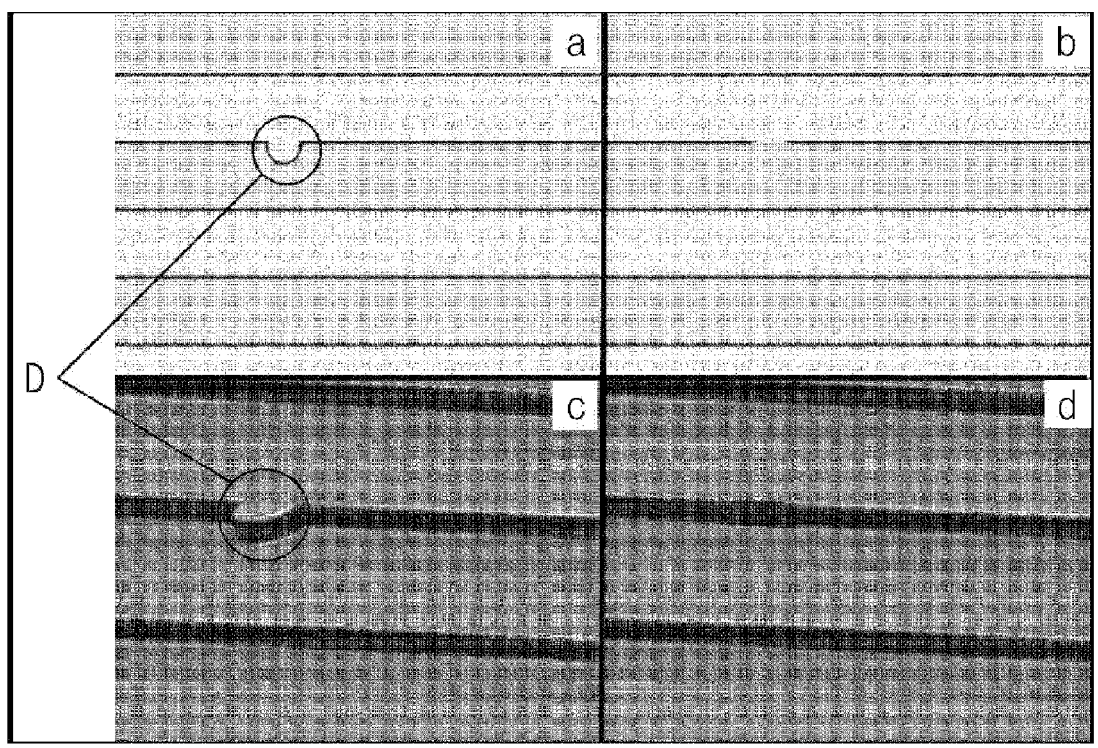
FIG. 6 illustrates an image of a photo mask before and after repair according to embodiments.

A pre-repaired photo mask and a repaired photo mask are shown in FIG. 6. In the figure, "D" represents a defect of the photo mask. Specifically, (a) and (c) are a top plan view and a perspective view of the pre-repaired photo mask, respectively, and (b) and (d) are a top plan view and a perspective view of the repaired photo mask, respectively. In FIG. 6, the defect (D) removal using the machining probe 112a is 3-dimensionally imaged with the imaging probe 114a.

Generally, investments in terms of money and time may too great to justify discarding an already-manufactured photo mask having a defect and to make a new one instead. Thus, when defects are found, attempts may be made to repair the photo mask to render it free of critical defects before cleaning and pellicle mounting steps are carried out. Repair of a photo mask may be attempted using methods that use, e.g., laser, focused ion beam (FIB), focused electron beam (FEB), or atomic force microscope (AFM)-based nano machining (NM). In the laser method, defect materials may be removed through the process of laser ablation, but poor spatial resolution may be a limitation. In the FIB method, defect materials may be removed through physical sputtering or etching, or materials may be deposited based on a precursor. While the FIB method may have advantages in terms of spatial resolution and working time relative to the laser, a substrate may be damaged by sputtering or by gallium-ion implantation. In the FEB method, a source of a scanning electron microscope (SEM) may be used. The FEB method may be slower than the FIB method, but the FEB method may be superior in terms of spatial resolution and chemical selectivity, and may reduce the damage of a photo mask. As described above, embodiments may use both a repairing atomic force microscope (AFM) for repair and an electron microscope (SEM) for observation. Thus, according to embodiments, the interaction of the machining probe and the pattern may be observed in real time during repair work. Generally, an atomic force microscope image may have artifacts induced by the interaction of the probe with the pattern. In contrast, embodiments may provide a realistic pattern by comparing images of the atomic force microscope (AFM) and the electron microscope (SEM). In an example embodiment, an image of the repaired photo mask may be obtained using an imaging probe of an imaging atomic force microscope probe that is different from the machining probe. Use of the separate imaging probe may provide a realistic image, instead of a distorted image that could be produced by a degraded machining probe during a repair work. Moreover, according to embodiments, since all the jobs, checking and replacing an AFM probe, may be done inside a vacuum chamber, significant time savings may be achieved.

As described above, embodiments relate to an apparatus and a method for repairing a photo mask using a probe of an atomic force microscope. A machining probe may be located at a defective portion of a photo mask. The defective portion of the photo mask may be removed by reciprocating the machining probe. The photo mask repair process may be observed using SEM. The shape of a repaired photo mask may be monitored in-situ using an imaging probe. The imaging probe may be different from the machining probe.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A method for repairing a photo mask, the method comprising:
   locating a machining probe of a repairing atomic force microscope at a defective portion of a photo mask;
   reciprocating the machining probe to remove the defective portion of the photo mask;
   using a scanning electron microscope to observe a photo mask repair process of the machining probe; and
   imaging in-situ a shape of a repaired photo mask using an imaging probe of an imaging atomic force microscope, the imaging probe being different from the machining probe.

2. The method as claimed in claim 1, further comprising:
   imaging the defective portion of the photo mask by the machining probe or the imaging probe before removing the defective portion of the photo mask.

3. The method as claimed in claim 1, wherein an end point of the photo mask repair process is determined by observing the photo mask repair process using the scanning electron microscope, and
   imaging of the repaired photo mask using an imaging probe is performed in higher magnification than the observing the photo mask repair process using the scanning electron microscope.

4. The method as claimed in claim 1, wherein using the scanning electron microscope to observe the photo mask repair process and imaging in-situ the shape of the repaired photo mask using the imaging probe are performed in a same vacuum chamber.

5. A method for repairing a photo mask, the method comprising:
loading a photo mask in a vacuum chamber;
roughly navigating a defective portion in the photo mask using an electron microscope or an optical microscope;
imaging a precise location of the defective portion using a repairing atomic force microscope or an imaging atomic force microscope;
locating a machining probe of the repairing atomic force microscope on the defective portion;
repairing the defective portion with the machining probe;
imaging in-situ a shape of the repaired photo mask using an imaging probe of the imaging atomic force microscope after the repair is finished, the imaging atomic force microscope being different from the repairing atomic force microscope;
monitoring a wearing degree of the machining probe; and
replacing the machining probe with a new probe by a replacement probe loading part in the vacuum chamber.

6. The method as claimed in claim 5, further comprising:
controlling an incident angle of an electron gun of the electron microscope by driving a rotation stage;
wherein the electron microscope is fixed to the vacuum chamber.

7. The method as claimed in claim 5, wherein monitoring the wearing degree is performed by a micro electron column and a micro column sliding stage.

8. The method as claimed in claim 7, wherein an angle of the machining probe with respect to the micro electron column is controlled by driving a rotation stage.

9. The method as claimed in claim 5, wherein repairing the defective portion is observed in real time using the electron microscope.

10. The method as claimed in claim 5, wherein repairing the defective portion is assisted by an ion beam device.

* * * * *